(12) United States Patent
Ranaweera (10) Patent No.: US 10,593,631 B2
(45) Date of Patent: Mar. 17, 2020

(54) WARPING REDUCTION IN SILICON WAFERS

(71) Applicant: Oracle International Corporation, Redwood Shores, CA (US)

(72) Inventor: Jeewika Ranaweera, San Jose, CA (US)

(73) Assignee: Oracle International Corporation, Redwood Shores, CA (US)

(*) Notice: Subject to any disclaimer, the term of this patent is extended or adjusted under 35 U.S.C. 154(b) by 0 days.

(21) Appl. No.: 15/945,665

(22) Filed: Apr. 4, 2018

(65) Prior Publication Data

US 2019/0311995 A1    Oct. 10, 2019

(51) Int. Cl.
| | |
|---|---|
| *H01L 23/00* | (2006.01) |
| *H01L 21/3205* | (2006.01) |
| *H01L 21/311* | (2006.01) |
| *H01L 21/768* | (2006.01) |
| *H01L 21/66* | (2006.01) |
| *H01L 23/58* | (2006.01) |
| *H01L 21/78* | (2006.01) |
| *H01L 23/522* | (2006.01) |
| *H01L 23/544* | (2006.01) |
| *H01L 23/528* | (2006.01) |

(52) U.S. Cl.
CPC ...... *H01L 23/562* (2013.01); *H01L 21/31111* (2013.01); *H01L 21/32051* (2013.01); *H01L 21/76802* (2013.01); *H01L 21/76877* (2013.01); *H01L 21/78* (2013.01); *H01L 22/20* (2013.01); *H01L 22/34* (2013.01); *H01L 23/528* (2013.01); *H01L 23/5226* (2013.01); *H01L 23/544* (2013.01); *H01L 23/585* (2013.01); *H01L 2223/5446* (2013.01); *H01L 2223/54426* (2013.01)

(58) Field of Classification Search
CPC .................................................... H01L 23/562
USPC .............................................................. 257/48
See application file for complete search history.

(56) References Cited

U.S. PATENT DOCUMENTS

| | | | |
|---|---|---|---|
| 6,291,884 B1 * | 9/2001 | Glenn | H01L 23/49816 257/747 |
| 6,521,975 B1 | 2/2003 | West et al. | |
| 7,952,167 B2 | 5/2011 | Lee et al. | |
| 8,952,497 B2 | 2/2015 | Chen et al. | |
| 2009/0075178 A1 * | 3/2009 | Jahnke | G03F 1/44 430/5 |
| 2010/0207251 A1 * | 8/2010 | Yu | H01L 21/78 257/620 |

(Continued)

OTHER PUBLICATIONS

Engineering Toolbox (https://www.engineeringtoolbox.com/thermal-expansion-metals-d_859.html) Retrieved Jul. 7, 2019.*

*Primary Examiner* — Jami Valentine Miller
(74) *Attorney, Agent, or Firm* — Kowert, Hood, Munyon, Rankin & Goetzel, P.C.

(57) ABSTRACT

Techniques for reducing stress in an integrated circuit wafer are disclosed. A silicon substrate may include multiple integrated circuit chips and multiple scribe regions situated between the one of the multiple integrated circuit chips. A particular scribe region includes a plurality of layers and a stress reduction structure that includes, at a particular layer of the plurality of layers, a material whose coefficient of thermal expansion of materials is greater than a coefficient of thermal expansion of the silicon wafer.

11 Claims, 8 Drawing Sheets

(56) References Cited

U.S. PATENT DOCUMENTS

2010/0252916 A1* 10/2010 Chen ................... H01L 21/78
  257/620
2012/0224133 A1*  9/2012 Makino ............ G02F 1/133351
  349/153

* cited by examiner

WARPING REDUCTION IN SILICON WAFERS

BACKGROUND

Technical Field

This disclosure relates to integrated circuit manufacture, and more particularly to reducing stress on integrated circuit wafers.

Description of the Related Art

Modern computer systems may include multiple integrated circuits, each designed to perform specific functions or operations. For example, a processor integrated circuit may be designed to execute software or program instructions retrieved from a memory integrated circuit. Other integrated circuits may be designed to generate regulated voltage levels for power supply signals or send and receive radio frequency or other electrical signals.

Circuit blocks included within an integrated circuit may be designed according to one of various design methods to generate design information. For example, a hardware description language such as, without limitation: VHDL, Verilog, SystemC, System Verilog, RHDL, M, MyHDL, etc., may be used to describe logical functionality of a particular circuit block. Some circuit blocks may be designed using schematics capture software, or other suitable computer-aided design (CAD) tool.

Using such design information, multiple photomasks may be generated that are used during the manufacture of the integrated circuits. Many copies of a particular integrated circuit may be manufactured simultaneously on a given silicon wafer using a semiconductor manufacturing process. Such a manufacturing process may include elements for depositing semiconducting materials (e.g., on the silicon wafer using one or more of the photomasks), removing materials, altering the shape of deposited materials, modifying materials (e.g., by doping materials or modifying dielectric constants using ultraviolet processing), and the like.

SUMMARY

Various embodiments of a method for reducing stress on an integrated circuit wafer are disclosed. Broadly speaking, an apparatus is disclosed, which includes a silicon substrate that includes a plurality of integrated circuit chips and a plurality of scribe regions situated between ones of the plurality of integrated circuit chips. A particular scribe region of the plurality of scribe regions may include a plurality of layers, and total area. A stress reduction structure, included in the particular scribe region, may be located on at least a particular layer of the plurality of layers. The stress reduction structure may include, at the particular layer, a material having a coefficient of thermal expansion of materials that is greater than a coefficient of thermal expansion of the silicon substrate. A collective area of the material at the particular layer is at least 40 percent of the total area of the particular scribe region.

In another embodiment, the material is metal, and the material is electrically isolated from one or more metal regions included in one or more integrated circuit chips adjacent to the particular scribe region.

In a non-limiting embodiment, the material is arranged in a plurality of non-contiguous regions. A space between a first and a second region of the plurality of non-contiguous regions corresponds to a minimum spacing specification for the semiconductor manufacturing process used to fabricate the plurality of integrated circuit chips.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

As semiconductor manufacturing technology continues to evolve, each subsequent technology node allows for reduction in the size of transistors, as well as increases in the number of metal and dielectric layers and chip size. The materials deposited on a silicon wafer in order to fabricate the metal and dielectric layers included in an integrated circuit chip have coefficients of thermal expansion greater than that of the silicon wafer. The difference in the coefficients of thermal expansion between the metal and dielectric layers and the silicon wafer result in a compressive stress on the silicon wafer, which may result in warpage of the silicon wafer even at room temperature. In the regions between integrated circuit chips on a silicon wafer, little material is deposited, resulting in regions of the silicon wafer that are stressed differently than those regions included in an integrated circuit chip, thereby causing uneven stress on the silicon wafer, which further exacerbates the warpage.

Such warpage in a silicon wafer may impact electrical performance of devices in an integrated circuit by affecting charge carrier mobility. Additionally, warpage of the silicon wafer may result in pattern misalignment and issues with focus during photolithography steps of the semiconductor manufacturing process. Issues may also arise with handling a warped silicon wafer resulting from a vacuum cup being unable to maintain a seal with the warped silicon wafer.

In some cases, semiconductor manufacturing processes allow for creating deep trenches between integrated circuit chips on a silicon wafer to reduce warpage. Such trenches, however, may only be effective for smaller chip sizes. As used and described herein, a semiconductor manufacturing process refers to a collection of steps or operations, including deposition, lithography, etching, and the like, that are performed to fabricated devices, such as, e.g., transistors, and interconnect between the devices on a silicon substrate or wafer to form integrated circuits. Multiple foundries, such as, e.g., TSMC, provide integrated circuit manufacturing services using any number of semiconductor manufacturing processes characterized by minimum features size such as 20 nm, for example. The embodiments illustrated in the drawings and described below may provide techniques for reducing warping in a silicon wafer for varying chip sizes.

Figure 1:
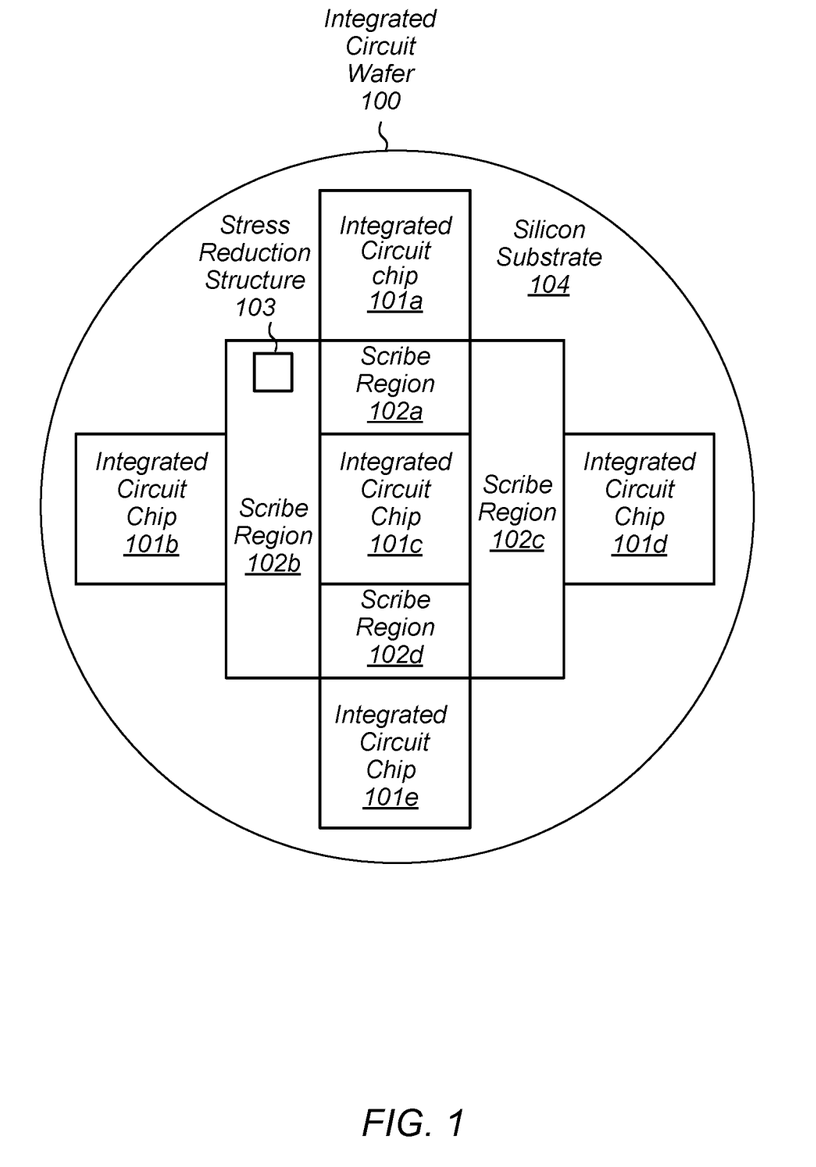
FIG. 1 is a block diagram of an integrated circuit wafer.

An embodiment of an integrated circuit wafer including multiple integrated circuits is illustrated in FIG. 1. In the illustrated embodiment, integrated circuit wafer 100 includes a plurality of integrated circuit chips (also referred to as "integrated circuit dies") arranged in an array, namely integrated circuit chip 101a through integrated circuit chip 101e, fabricated on a silicon substrate. In various embodiments, integrated circuit chip 101a through integrated circuit chip 101e may include a processor, processor core, a memory circuit, an input/output circuit, a system-on-a-chip (SoC), or other suitable circuit block or combination of circuit blocks. Although only five integrated circuit chips are depicted in the embodiment of FIG. 1, in other embodiments, any suitable number of integrated circuit chips may be fabricated on integrated circuit wafer 100.

In addition to the plurality of integrated circuit chips, integrated circuit wafer 100 also includes plurality of scribe regions (scribe region 102a through scribe region 102d) situated between ones of the plurality of integrated circuit chips. It is noted that although only four scribe regions are depicted in the embodiment illustrated in FIG. 1, in other embodiments, any suitable number of scribe regions may be employed. As used and described herein, a scribe region refers to a region on an integrated circuit wafer between two adjacent integrated circuit chips that provides an area to cut in order to separate the two adjacent integrated circuit chips.

A particular scribe region, such as, e.g., scribe region 102b, of the plurality of scribe regions includes a plurality of layers and has a total area. In the present embodiment, the particular scribe region also includes a stress reduction structure, such as, e.g., stress reduction structure 103, located on at least a particular layer of the plurality of layers. As described below in more detail, a stress reduction structure includes materials on one or more layers of the plurality of layers. When a stress reduction structure is said to be located on a particular layer, the stress reduction structure includes a material on the particular layer.

Stress reduction structure 103 includes a material at the particular layer, and a collective area of the material is at least 40 percent of the total area of the scribe regions surrounding an integrated circuit chip. It is noted that in FIG. 1, for the purpose of illustration, stress reduction structure 103 is not drawn to scale. In such cases, a particular scribe region, such as, e.g., scribe region 102a, could include material that is greater than 40% of the area of the particular scribe region, while another scribe region could be populated with material that is less than 40% of the other scribe region's area. Moreover, the material has a coefficient of thermal expansion greater than a coefficient of thermal expansion of silicon substrate 104. As described below, the plurality of layers includes metal layers separated by an insulating or dielectric material. By including a stress reduction structure in a scribe region, compressive stress on integrated circuit wafer 100 in the scribe region is similar to the compressive stress on integrated circuit wafer 100 in an integrated circuit region. Since the compressive stress is more uniform across the entire integrated circuit wafer 100, warping of integrated circuit 100 may be reduced.

In some embodiments, the material is metal, such as, e.g., a copper, or other metal available in the semiconductor manufacturing process. Moreover, the material may be electrically isolated from one or more metal structures included in one or more integrated circuit chips adjacent to the particular scribe region. In various embodiments, the material may be arranged in a plurality of non-contiguous regions, where a space between a first and a second region of the plurality of non-contiguous regions corresponds to a minimum spacing specification for a semiconductor manufacturing process used to fabricate the plurality of integrated circuit chips.

A stress reduction structure may not be limited to having material on a single layer. In some embodiments, the stress reduction structure also includes the material, at another layer of the plurality of layers. The collective area of the material at the another layer is also at least 40 percent of the total are of the corresponding scribe region.

As described in more detail below, when a stress reduction structure is located on multiple layers, the material on a particular layer may be coupled to the material on another layer. In such cases, a via, or other suitable structure, may be used to couple the material on the two layers.

Although scribe region 102b is depicted as including one stress reduction structure, in other embodiments, multiple stress reduction structures may be included in a given scribe region. When multiple stress reduction structures are used in a given scribe region, the stress reduction structures may be arranged in a grid, or an array, or any other suitable type of arrangement.

In addition to using different numbers of stress reduction structures, the size of a given stress reduction structure may vary in different embodiments. As stated above, the collective area of material included at a particular layer of the stress reduction structure is at least 40 percent of the total area of its corresponding scribe region. In other cases, the collective area of the material included at the particular layer of the stress reduction structure may be as much as one hundred percent of the total area of the corresponding scribe region.

The size of a stress reduction structure, as well as the arrangement of multiple stress reduction structures within a given scribe region, are based, at least in part, on the size of silicon substrate 104, the size integrated circuit chips 101a-101e, and a desired level of stress reduction. For example, greater levels of stress reduction may be achieved by increasing the area of the stress reduction structure, or by including more stress reduction structures within a given scribe region. In some cases, fifty to one hundred percent of the area of a scribe region may be used for one or more stress reduction structures.

As described below in more detail, stress reduction structure 103 may include a plurality of metal structures. Such metal structures may be fabricated on a plurality of metal layers available in a semiconductor manufacturing process. In some embodiments, metal structures fabricated on a given metal layer may be coupled to metal structures fabricated on another metal layer. In some embodiments, the metal layers, on which the metal structures of stress reduction structure 103 are fabricated, may be isolated by a dielectric layer, such as, silicon dioxide, for example.

It is noted that the embodiment of the integrated circuit wafer depicted in FIG. 1 is merely an example. As described above, different numbers and sizes of stress reduction structures are possible and contemplated.

Figure 2:
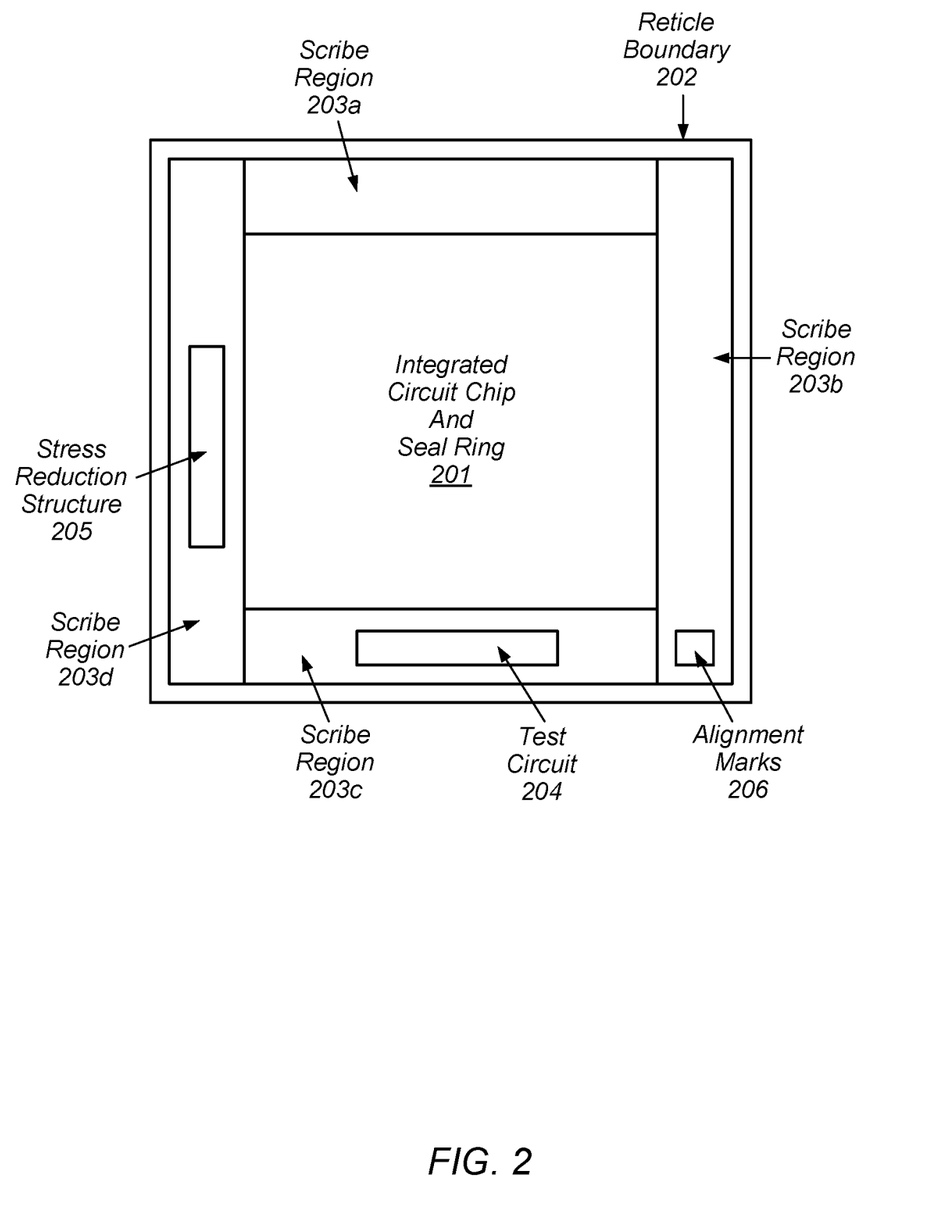
FIG. 2 illustrates a block diagram of a particular instance of an integrated circuit on an integrated circuit wafer.

As described above, a scribe region delineates individual integrated circuit chips on a silicon wafer. In addition to including stress reduction structures in a scribe region, other circuits and structures may also be included. A block diagram of an integrated circuit chip and its associated scribe regions is depicted in FIG. 2.

In the illustrated embodiment, integrated circuit chip and seal ring 201 are surrounded by scribe region 203a through scribe region 203d. As used and described herein, a seal ring refers to a structure fabricated at the edge of an integrated circuit that completes or "seals off" the edge of the integrated circuit to prevent the incursion of water or other contaminants into the integrated circuit.

Integrated circuit chip and seal ring 201, along with scribe region 203a through scribe region 203d are included within reticle boundary 202. As used herein, a reticle boundary refers to a field of exposure for a photomask that is used in the fabrication of a particular layer of an integrated circuit, its associated seal ring, and adjacent scribe regions. Although depicted as distinct scribe regions, scribe region 203a through scribe region 203d may be a single scribe region that surrounds integrated circuit and seal ring 201.

In the illustrated embodiment, scribe region 203d includes stress reduction structure 205. In various embodiments, stress reduction structure 205 may correspond to stress reduction structure 103 as illustrated in the embodiment of FIG. 1. As described below in more detail, stress reduction structure 205 may include metal or other structures that reduce compressive stress on a silicon wafer, on which integrated circuit chip and seal ring 201 are fabricated. Such metal structures are not physically coupled to metal structures included in integrated circuit chip and seal ring 201, thereby electrically isolating stress reduction structure 205. Although only a single stress reduction structure is depicted in the embodiment illustrated in FIG. 2, in other embodiments, multiple stress reduction structures may be employed and arranged in any available scribe region.

As previously mentioned, a scribe region may include other items beyond a stress reduction structure. In the illustrated embodiment, scribe region 203c includes test circuit 204. In various embodiments, test circuit 204 may include devices of various physical sizes and orientations to allow for the electrical characterization of the devices to ensure the devices are achieving desired performance. In some cases, small subcircuits, such as, e.g., memory cell circuits, may also be included in test circuit 204 to allow for the characterization of the subcircuits. In various embodiments, test circuit 204 and stress reduction circuit are electrically isolated.

Additionally, test circuit 204 may include structures used to characterize the electrical characteristics, such as, e.g., resistance, of interconnect similar to that used in an integrated circuit chip. Such structures may, in various embodiments, include comb structures or other serpentine-style metal structures.

In addition to stress reduction structures and test circuits, scribe regions may also include alignment targets. In the illustrated embodiment, scribe region 203b includes alignment marks 206. During manufacture, when a next photomask is to be used in an exposure for a next layer in the semiconductor manufacturing process, it is aligned to a known structure that was fabricated on a previous layer in the semiconductor manufacturing process.

Such structures are commonly placed in a scribe region, such as scribe region 203b, for example. The structures may include one or more shapes to be fabricated on the layer corresponding to a particular mask. Subsequent photomasks may then be aligned to the fabricated structures prior to exposure. Although only a single set of alignment marks are illustrated in FIG. 2, in other embodiments, any suitable number of alignment marks may be employed.

It is noted that the embodiment illustrated in FIG. 2 is merely an example. In other embodiments, different arrangements and scribe regions are possible and contemplated.

As previously mentioned, in order to reduce the stress on the silicon wafer, materials with a coefficient of thermal expansion greater than a coefficient of thermal expansion of the silicon wafer are included in a stress reduction structure. In addition to varying the area of the stress reduction structure, the volume of the stress reduction structure may also be modified for different applications. To create such a volumetric stress reduction structure, multiple metal structures on multiple metal layers, separated by a dielectric material, may be fabricated as part of the stress reduction structure. A cross-section of an embodiment of stress reduction structure fabricated on silicon wafer 301 is illustrated in the block diagram of FIG. 3. In various embodiments, stress reduction structure 302 may correspond to stress reduction structure 103 as illustrated in the embodiment of FIG. 1.

Figure 3:
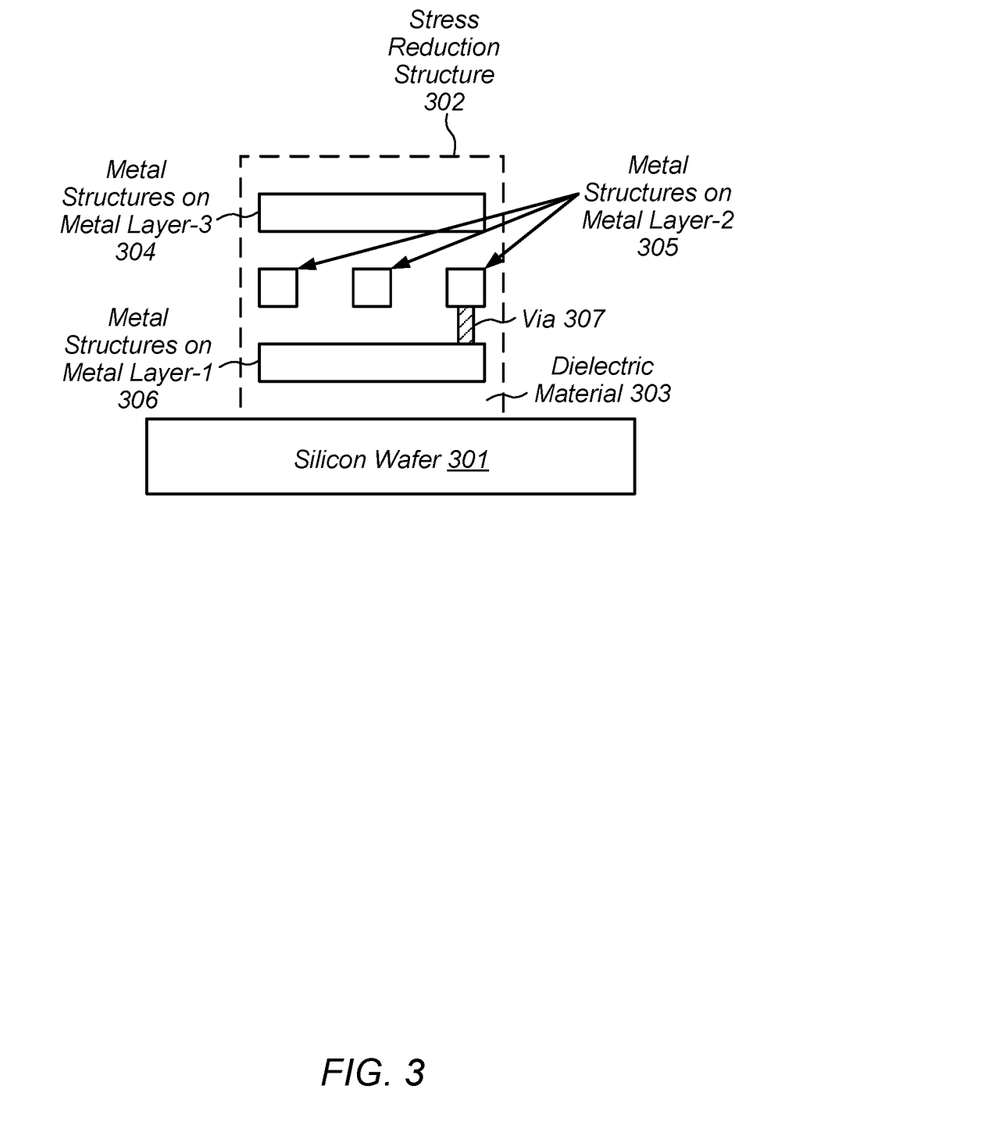
FIG. 3 illustrates a block diagram of a cross section of a stress reduction structure included on an integrated circuit wafer.

Stress reduction structure 302 includes a plurality of metal structures fabricated on different metal layers. For example, in the present embodiment, stress reduction structure 302 includes metal structures on metal layer-1 306, metal structures on metal layer-2 305, and metal structures on metal layer-3 304. Although only three metal layers are depicted, in other embodiments, any suitable number of metal layers may be employed. For example, in some cases, metal structures may be fabricated in the stress reduction structure using each metal layer available in a semiconductor manufacturing process. In other cases, only a single metal layer may be employed, thereby allowing an adjustment of the volume of a given stress reduction structure from approximately ten percent to close to one hundred percent of the available volume associated with a base area of the stress reduction structure.

In various embodiments, the metal structures fabricated on the various metal layers may include copper, or any other suitable metal or conductive material. In some cases, the coefficient of thermal expansion of the material employed, such as, e.g., copper, may impact the area of stress reduction structure, a number of stress reduction structures employed, or the volume associated with a given stress reduction structure.

Each of the aforementioned metal layers are isolated from one another by dielectric material 303. In various embodiments, dielectric material 303 may be deposited before and after the deposition of the metal layers included in stress reduction structure 302. In some cases, the dielectric material may include silicon dioxide or any other suitable dielectric material.

In some embodiments, a metal structure fabricated on one metal layer may be coupled to a metal structure fabricated on a different metal layer using a via, such as via 307, for example. During the semiconductor manufacturing process, holes may be etched in deposited dielectric materials, such as dielectric material 303, for example. Once the holes have been etched, a conductive material, such as, e.g., tungsten, may be deposited into the holes to form a via. A subsequent layer of metal may then be deposited an etched to form metal structures. Metal structures that are arranged to be in contact with a fabricated via will be coupled to an underlying metal structure on a different metal layer.

It is noted that the embodiment of the stress reduction structure depicted in the block diagram of FIG. 3 is merely an example. In other embodiments, different metal structures and different arrangements of metal structures included in the stress reduction structure may be employed.

As mentioned above, the material included in a stress reduction structure may include multiple non-contiguous regions fabricated on multiple metal layers isolated by dielectric materials. On a given layer, such regions may be of varying shapes and arranged in a variety of orientations in order to achieve a particular density of metal on the given layer. As with the area and volume of a stress reduction structure, the density of the structure used on a given layer may be adjusted to achieve a particular level of stress reduction on a silicon wafer or substrate. Embodiments of the shape and arrangements of metal structures for a particular metal layer in a stress reduction structure are illustrated in the embodiments depicted in FIG. 4A and FIG. 4B.

Figure 4A:
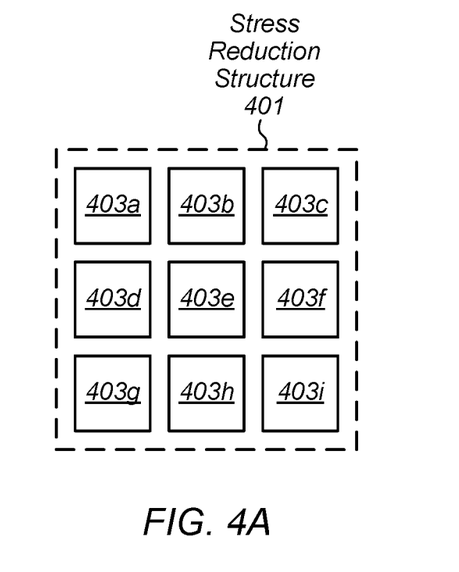
FIG. 4A illustrates a block diagram depicting an embodiment of a topology of metal structures included on a given metal layer in a stress reduction structure.

Stress reduction structure 401 illustrated in FIG. 4A may, in various embodiments, correspond to stress reduction structure 103 as illustrated in the embodiment of FIG. 1. In the illustrated embodiment, stress reduction structure 401 includes metal regions 403a through 403i, which are arranged in an array and may be non-contiguous. In the present embodiments, metal regions 403a through 403i are fabricated on a common metal layer. In other embodiments, different arrangements of metal regions may be fabricated on different metal layers. Although nine metal regions are depicted as being included in stress reduction structure 401, in other embodiments, any suitable number of metal regions may be employed.

Each of metal regions 403a through 403i may be substantially square, and their size may be based on characteristics of a semiconductor manufacturing process used for fabrication or may be based on a desired level of stress reduction. For example, the size of a particular one of metal regions 403a through 403i may correspond to a maximum allowable size of a metal region for a particular metal layer specified by the semiconductor manufacturing process being employed. By adjusting the size of the metal regions and the space between adjacent metal regions, the metal density for a given layer included in the stress reduction structure may be adjusted to meet design goals. Additionally, the shape, spacing, and number of metal regions on the given metal layer included in a stress reduction structure may be determined by a computer-aided design software tool or other software program to generate a desired level of stress reduction. In some cases, the shape and spacing of the metal regions may be similar to those used in metal fill regions (commonly referred to as "dummy metal") on an integrated circuit chip.

Figure 4B:
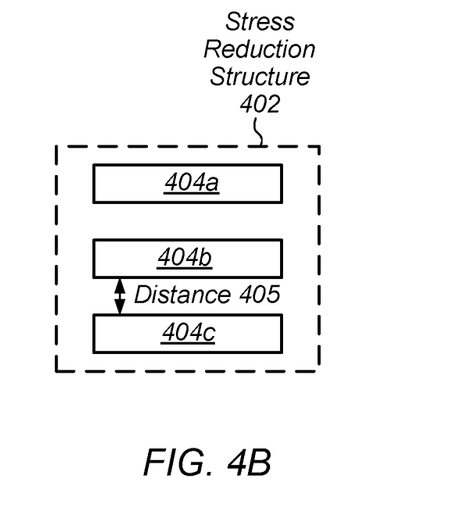
FIG. 4B illustrates a block diagram depicting another embodiment of a topology of metal structures included on a given metal layer in a stress reduction structure.

Turning to FIG. 4B, stress reduction structure 402 includes another arrangement of metal regions for a particular metal layer. In the illustrated embodiment, stress reduction structure 402 includes metal regions 404a through 404c, which are substantially rectangular. Metal region 404b and metal region 404c are arranged such that the two metal regions are separated by distance 405. In various embodiments, distance 405 may correspond to a minimum distance between two metal regions fabricated on a common metal layer. It is noted, that to achieve a particular metal density of a particular metal layer for a stress reduction structure, any suitable combination of metal shapes, sizes, and spaces may be employed.

It is noted that the embodiments depicted in FIG. 4A and FIG. 4B are merely examples. In other embodiments, different shapes and arrangements of metal structures in a stress reduction structure are possible and contemplated.

Figure 5:
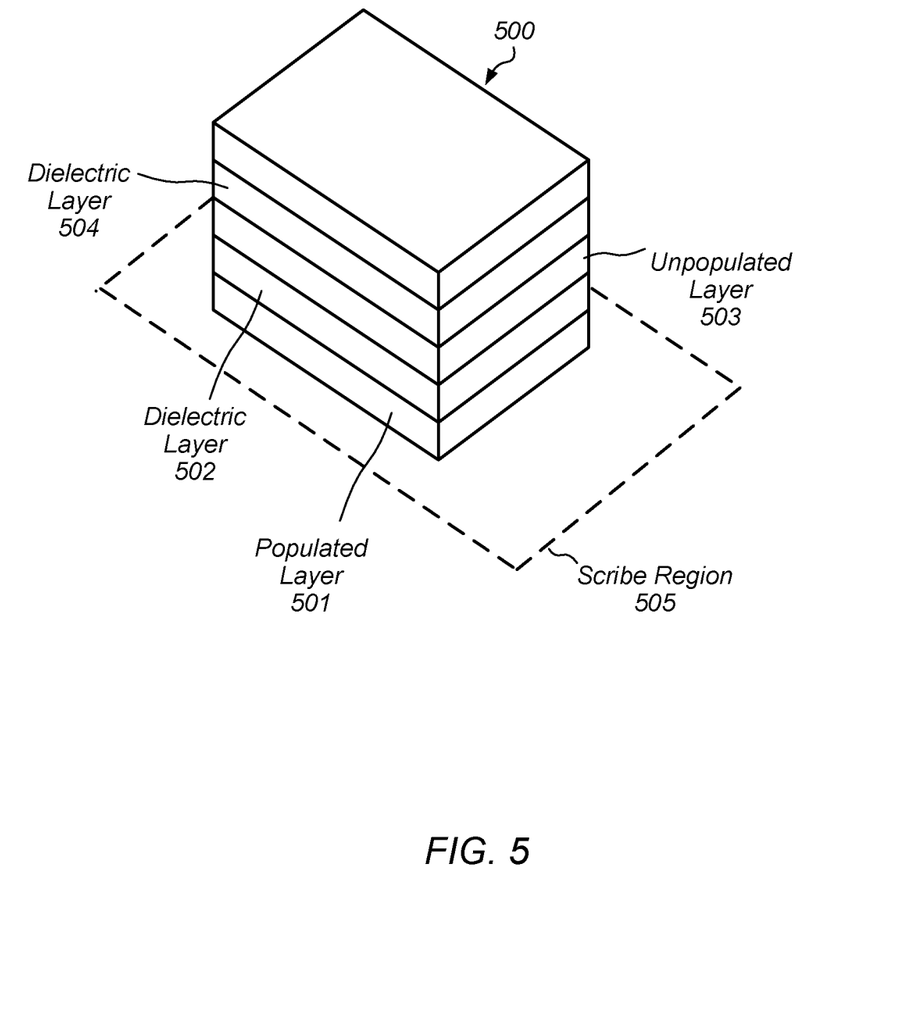
FIG. 5 illustrates a block diagram depicting an embodiment of a stress reduction structure.

As described above, the volume of a stress reduction structure may be adjusted in order to achieve a particular level of stress reduction. The block diagram of FIG. 5 illustrates how the volume of a stress reduction structure may be adjusted. In the illustrated embodiment, stress reduction structure 500 includes populated layer 501, unpopulated layer 503, dielectric layer 502, and dielectric layer 504.

Populated layer 501 may correspond to a particular metal layer available in a semiconductor process and includes one or more metal structures fabricated on the corresponding metal layer. As described below in more detail, the one or more metal structures may be fabricated by depositing, then etching a metal, such as copper, for example. The collective area of the metal regions in populated metal layer 501 is at least 40 percent of the area of scribe region 505. In various embodiments, the one or more regions included in populated metal layer 501 may be similar to the structures depicted in FIG. 4A or FIG. 4B. It is noted that when multiple populated metal layers are used in a stress reduction structure, the density of metal on any given populated metal layer may be greater than 40 percent of the area of the corresponding scribe area.

Unpopulated layer 503 may correspond to another metal layer available in the semiconductor manufacturing process different than the layer of populated layer 501. Unpopulated layer 503 does not include any metal structures fabricated on its corresponding metal layer. In some cases, the layer may simply include a dielectric material. By not including metal structures on a particular metal layer, the volume of stress reduction structure 500 can be adjusted. In general, the more metal layers that include metal regions in the stress reduction structure, the larger the volume of the stress reduction structure, and the larger the amount of stress reduction generated by the stress reduction structure.

In the present embodiment, one populated metal layer and one unpopulated metal layer are included in stress reduction structure 500. In other embodiments, any suitable combination of populated and unpopulated metal layers may be employed. For example, a stress reduction structure may include metal regions fabricated on at least half of the metal layers available on a semiconductor manufacturing process, leaving the remaining metal layers unpopulated. The unpopulated metal layers may be evenly distributed between metal layers that include metal regions or arranged amongst the metal layers containing metal structures in any suitable arrangement.

Dielectric layer 502 and dielectric layer 504 may include any suitable dielectric material suitable for insulating between metal layers. For example, in some cases, dielectric layers 502 and 504 includes silicon dioxide, which may be deposited during fabrication of scribe region 505.

Although only two metal layers and two dielectric layers are depicted in the embodiment of FIG. 5, in other embodiments, any suitable number of metal and dielectric layers may be employed.

Figure 6:
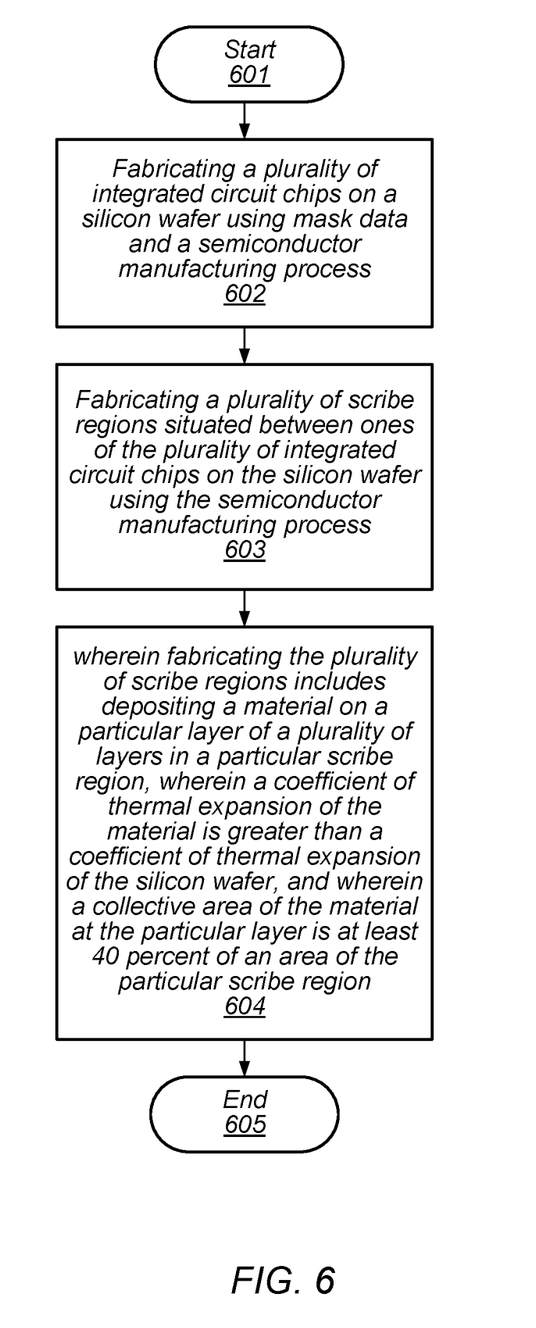
FIG. 6 is flow diagram illustrating an embodiment of a method for fabricating an integrated circuit wafer with stress reduction structures.

Turning to FIG. 6, a flow diagram depicting an embodiment of a method for reducing stress on a silicon wafer is illustrated. The method may, in various embodiments, be used to fabricate an integrated circuit wafer, such as, e.g., integrated circuit wafer 100 as illustrated in FIG. 1. The method begins in block 601.

A plurality of integrated circuit chips may be fabricated on a silicon wafer using mask data and a semiconductor manufacturing process (block 602). In various embodiments, a silicon foundry company, or another suitable company may generate multiple photomasks using the mask data for use with the semiconductor manufacturing process. The integrated circuit chips may be any suitable type of integrated circuit chip, such as, e.g., a processor chip, memory chip, system-on-a-chip, and the like.

The plurality of integrated circuit chips may be arranged in an array of rows and columns, and a number of the integrated circuit chips included in the plurality of integrated circuit chips may be based on a size of the silicon substrate or wafer and a size of given one of the integrated circuit chips.

As described above, a space is left, during the manufacturing processing, between adjacent integrated circuit chips. In such spaces, which are situated between the ones of the plurality of integrated circuit chips, a plurality of scribe regions may be fabricated on the silicon wafer using the semiconductor manufacturing process (block 603). As described above, a given scribe area may include multiple structures or circuits. For example, the given scribe area may include a test circuit or alignment mark.

Fabricating the plurality of stress reduction structure includes depositing a material on a particular layer of a plurality of layers in a particular scribe region, where a coefficient of thermal expansion of the material is greater than a coefficient of thermal expansion of the silicon wafer, and where a collective area of the material at the particular layer is at least 40 percent of an area of the particular scribe region (block 604). By fabricating the particular scribe region to include a stress reduction structure, the stress across in the integrated circuit wafer may, in various embodiments, be reduced. It is noted that although only a single stress reduction structure is described, in other embodiments, any suitable number of stress reduction structures may be employed.

In some embodiments, the material may be etched to form a plurality of non-contiguous regions. Prior to etching the first layer of metal, a photo resistive material may be deposited on the first layer of metal. The photo resistive material may then be exposed using a photo mask to determine areas of the metal to be etched away, forming the plurality of non-contiguous regions.

It is noted that in some cases, a space between a first region and a second region of the plurality of non-contiguous regions corresponds to a minimum spacing specification for the semiconductor manufacturing process used to fabricate the plurality of integrated circuit chips. By using the minimum space between metal regions supported by the semiconductor manufacturing process, a density of metal on a given metal layer in the stress reduction structure may be increased, thereby increasing a level of stress reduction.

In addition to depositing material on a particular layer of the plurality of layers in the stress reduction structure, in other embodiments, material may be deposited on another layer of the plurality of layers. The material on the another layer may be etched to form another plurality of non-contiguous regions. Steps performing for depositing and etching the second layer of material may be similar to those described above in regard to the first layer of material. Although the deposition and etching of two layers of material are described above, in other embodiments, any suitable number of layers may have material deposited and etched.

In addition to depositing the first and second layers of material, a dielectric layer may be deposited between the first and second metal layers. Additionally, a via may be fabricated between a particular region of the plurality of first regions and a particular region of the plurality of second regions. It is noted that although only a single via is described above, in other embodiments, multiple vias between multiple regions, on multiple layers, may be fabricated. While the use of vias between regions on the various layers in the stress reduction structure couple regions on different layers, it is noted that the regions in the stress reduction structure remain electrically isolated from adjacent integrated circuits and test circuits.

The method concludes in block 605. Although the operations described in the flow diagram of FIG. 6 are depicted as being performed in a serial fashion, in other embodiments, one or more of the operations may be performed in parallel.

Prior to beginning manufacturing of an integrated circuit wafer, photomasks used in the processing elements of a semiconductor manufacturing process are created. An embodiment of a method for generating such photomasks is illustrated in the flow diagram of FIG. 7. In various embodiments, the method described in the flow diagram of FIG. 7 may correspond to portions of the operations included in blocks 603 and 604 of the method depicted in the flow diagram of FIG. 6.

Figure 7:
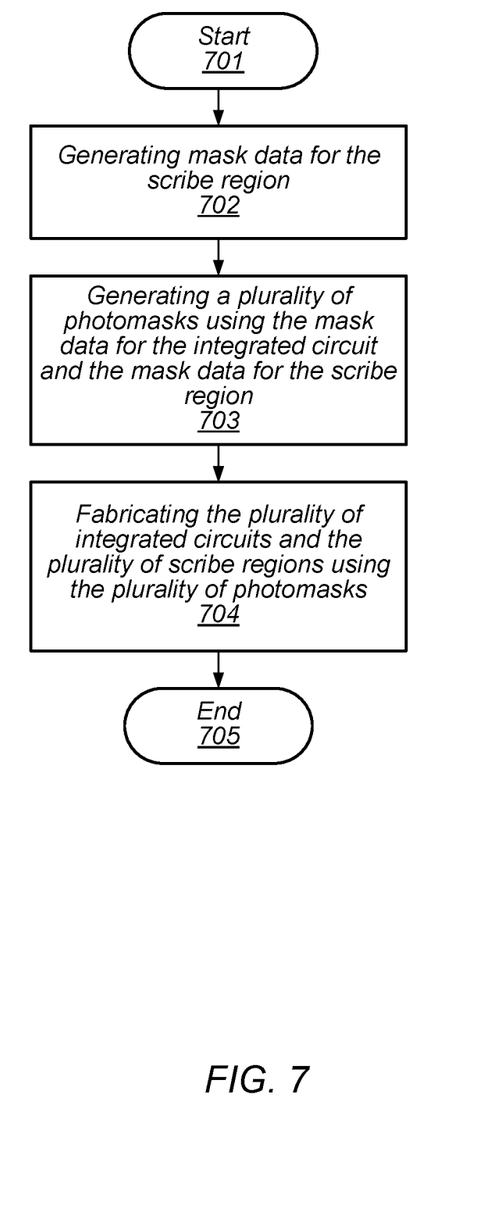
FIG. 7 is a flow diagram illustrating an embodiment of a method for generating photomasks for use in manufacturing an integrated circuit wafer.

The method begins in block 701. Mask data for the scribe region may then be generated (block 702). As described above, a scribe region may include test circuits in addition to stress reduction structures. In some embodiments, the test circuits may be designed in a fashion similar to circuit blocks included in an integrated circuit to generate design information to be used in generating mask data for the scribe region. Mask data for stress reduction structures included in the scribe region may be generated using a computer-aided design software program or other suitable automated design method. Mask data for a stress reduction structure may include data indicative of shape, spacing, and layer information for multiple metal regions included in the stress reduction structure.

A plurality of photomasks may then be generated using the mask data for the integrated circuit and the mask data for the scribe region (block 703). In various embodiments, prior to performing sizing or other operations, individual processing layers included in the mask data may be separated. In various embodiments, in addition to performing sizing operations on the data, the data may be inverted to generate negative photomasks based upon the layer and processing elements included in the semiconductor manufacturing process. Once the data for a particular processing layer has been operated upon, a photomask may be generated for the layer by selectively etching chrome metal from fused silica blank.

Using the generated photomasks, the plurality of integrated circuits and the plurality of scribe regions may then be fabricated (block 704). In various embodiments, a particular photomask may be used to pattern structures on a single layer included in the semiconductor manufacturing process. The particular photomask may correspond to structures for a single instance of an integrated circuit. As such, during the manufacturing process, the photomask may be stepped from one location to another in order to allow for the manufacture of multiple integrated circuits. Once the fabrication of the plurality of integrated circuits and the plurality of scribe regions is complete, the method may conclude in block 705.

It is noted that the embodiment of the method depicted in the flow diagram of FIG. 7 is merely an example. In other embodiments, different operations and different orders of operations may be employed.

Once the processing elements of the semiconductor manufacturing process have been completed, the manufactured integrated circuit may undergo initial testing prior to be separated from each other for packaging or other assembly. An embodiment of a method for a separating the manufactured integrated circuits is illustrated in the flow diagram of FIG. 8. The method begins in block 801.

Figure 8:
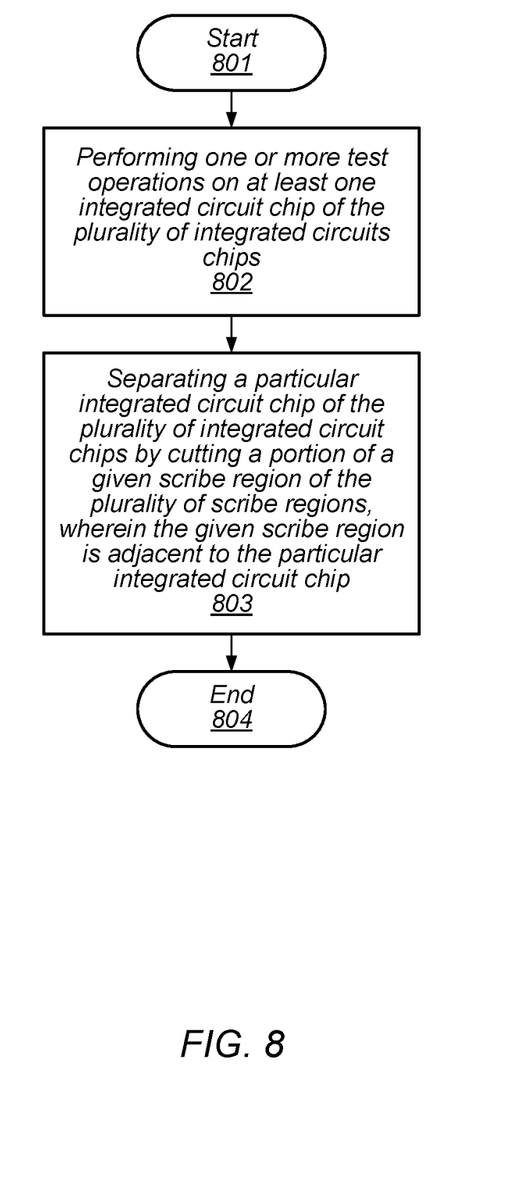
FIG. 8 is a flow diagram depicting an embodiment of a method for separating a particular integrated circuit from an integrated circuit wafer.

One or more test operations may be performed on at least one integrated circuit of the plurality of integrated circuits (block 802). In various embodiments, the one or more test operations may include functional tests to verify correct logical operation of logic circuits included in the at least one integrated circuit. In some cases, the operation of such circuits may be tested at different power supply voltage levels and/or different temperatures. The testing may be performed using a tester, which places needles or other suitable structures, in contact the solder bumps, bond pads, or the like, included in the at least one integrated circuit to provide stimulus, such as power supply signal voltage levels, test data, and the like. Integrated circuits that fail testing may be marked so they are not used in further packaging or assembly.

Once testing in complete, a particular integrated circuit chip of the plurality of integrated circuits may be separated by cutting a portion of a given scribe area of the plurality of scribe areas, where the given scribe area is adjacent to the particular integrated circuit chip (block 803). Such cutting may be performed using a saw or other suitable mean. During the cutting process, test circuits, and stress reduction structures may be destroyed as the scribe areas are cut. The method may then conclude in block 804.

It is noted that the embodiment of the method depicted in the flow diagram of FIG. 8 is merely an example. In other embodiments, different operations or different orders of operations are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An integrated circuit wafer, comprising:
a silicon substrate that includes:
a plurality of integrated circuit chips; and
a plurality of scribe regions situated between ones of the plurality of integrated circuit chips, wherein a particular scribe region of the plurality of scribe regions has a total area and includes a plurality of vertically stacked layers, wherein the particular scribe region includes a stress reduction structure located on at least a particular layer of the plurality of vertically stacked layers, wherein the stress reduction structure includes, on the particular layer, a material, wherein a collective area of the material on the particular layer is at least 40 percent of the total area of the particular scribe region, and wherein the material is metal that is electrically isolated from one or more metal regions included in the plurality of integrated circuit chips adjacent to the particular scribe region, and has a coefficient of thermal expansion that is greater than a coefficient of thermal expansion of the silicon substrate.

2. The integrated circuit wafer of claim 1, wherein the metal is arranged in a plurality of non-contiguous regions.

3. The integrated circuit wafer of claim 2, wherein a space between a first and second of the non-contiguous regions corresponds to a minimum spacing specification for a semiconductor manufacturing process used to fabricate the plurality of integrated circuit chips.

4. The integrated circuit wafer of claim 1, wherein the stress reduction structure further includes, on a different layer of the plurality of vertically stacked layers, the material, wherein a collective area of the material on the different layer is at least 40 percent of the total area of the particular scribe region.

5. The integrated circuit wafer of claim 4, wherein the stress reduction structure further includes at least one via coupled to the material on the particular layer and the material on the different layer.

6. An apparatus, comprising:
a silicon substrate that includes:
a plurality of integrated circuit chips; and
a plurality of scribe regions situated between one of the plurality of integrated circuit chips, wherein a particular scribe region of the plurality of scribe regions includes:
a plurality of vertically stacked layers;
a stress reduction structure located on at least a particular layer of the plurality of vertically stacked layers, wherein the stress reduction structure includes, on the particular layer, a material, wherein a collective area of the material on the particular layer is at least 40 percent of a total area of the particular scribe region, and wherein the material is metal that is electrically isolated from one or more metal regions included in the plurality of integrated circuit chips adjacent to the particular scribe region, and has a coefficient of thermal expansion that is greater than a coefficient of thermal expansion of the silicon substrate;
a test circuit; and
one or more mask alignment targets.

7. The apparatus of claim 6, wherein the metal within the particular layer is arranged in a plurality of non-contiguous regions.

8. The apparatus of claim 7, wherein a space between a first and second of the non-contiguous regions corresponds to a minimum spacing specification for a semiconductor manufacturing process used to fabricate the plurality of integrated circuit chips.

9. The apparatus of claim 6, wherein the stress reduction structure further includes on a different layer of the plurality of vertically stacked layers, the material, wherein a collective area of the material at the different layer is at least 40 percent of the total area of the particular scribe region.

10. The apparatus of claim 9, wherein the stress reduction structure further includes at least one via coupled to the material on the particular layer and the material on the different layer.

11. The apparatus of claim 6, wherein the material comprises copper.

\* \* \* \* \*